(12) United States Patent
Wang et al.

(10) Patent No.: US 12,024,785 B2
(45) Date of Patent: Jul. 2, 2024

(54) DUAL WAFER PLATING FIXTURE FOR A CONTINUOUS PLATING LINE

(71) Applicant: Maxeon Solar Pte. Ltd., Singapore (SG)

(72) Inventors: Hung-Ming Wang, San Jose, CA (US); Paul W. Loscutoff, Castro Valley, CA (US); Raphael M. Manalo, San Jose, CA (US); Arnold V. Castillo, Batangas (PH); Mohamad Ridzwan Mustafa, Johor Bahru (MY); Mark A. Kleshock, Phoenix, AZ (US); Neil G. Bergstrom, Los Altos, CA (US)

(73) Assignee: Maxeon Solar Pte. Ltd., Singapore (SG)

( * ) Notice: Subject to any disclaimer, the term of this patent is extended or adjusted under 35 U.S.C. 154(b) by 0 days.

(21) Appl. No.: 18/107,312

(22) Filed: Feb. 8, 2023

(65) Prior Publication Data
US 2023/0193502 A1    Jun. 22, 2023

Related U.S. Application Data

(62) Division of application No. 16/295,995, filed on Mar. 7, 2019, now Pat. No. 11,598,018.
(Continued)

(51) Int. Cl.
*C25D 7/12* (2006.01)
*C25D 17/00* (2006.01)
(Continued)

(52) U.S. Cl.
CPC ............ *C25D 17/08* (2013.01); *C25D 7/126* (2013.01); *C25D 17/001* (2013.01);
(Continued)

(58) Field of Classification Search
None
See application file for complete search history.

(56) References Cited

U.S. PATENT DOCUMENTS 6,228,231 B1   5/2001   Uzoh
6,299,745 B1   10/2001  Kumar et al.
(Continued)

FOREIGN PATENT DOCUMENTS

CN    87100995 A   3/1988
CN    1908247 A    2/2007
(Continued)

OTHER PUBLICATIONS

English translation JPH03138400 (Year: 1991).*
(Continued)

*Primary Examiner* — Stefanie S Wittenberg
(74) *Attorney, Agent, or Firm* — Schwabe, Williamson & Wyatt, P.C.

(57) ABSTRACT

A wafer plating fixture for use in simultaneously electroplating a two substrates. The wafer plating fixture including: an electrically conductive carrier bus; a plurality of contact clips electrically coupled to the carrier bus and configured to hold the two substrates in place and electrically couple the two substrates to the carrier bus; and a non-conductive substrate backer to separate the two substrates coupled to the carrier bus. A method of electroplating a plurality of substrates. The method including: mounting two substrates to be plated onto a wafer plating fixture; mounting the wafer plating fixture on a continuous belt of plating system; dipping the wafer plating fixture with the two substrates held thereon into an electroplating bath; and applying a voltage to the two substrates via the wafer plating fixture.

14 Claims, 12 Drawing Sheets

Related U.S. Application Data

(60) Provisional application No. 62/650,858, filed on Mar. 30, 2018.

(51) Int. Cl.
  *C25D 17/08* (2006.01)
  *H01L 31/05* (2014.01)

(52) U.S. Cl.
  CPC ......... *C25D 17/007* (2013.01); *C25D 17/008* (2013.01); *H01L 31/0504* (2013.01)

(56) References Cited

U.S. PATENT DOCUMENTS

| | | | |
|---|---|---|---|
| 8,221,600 | B2 | 7/2012 | Ganti |
| 8,221,601 | B2 | 7/2012 | Chen et al. |
| 8,317,987 | B2 | 11/2012 | Abas et al. |
| 9,222,193 | B2 | 12/2015 | Abas et al. |
| RE46,088 | E | 8/2016 | Chen et al. |
| 9,657,406 | B2 | 5/2017 | Asa et al. |
| 2005/0061665 | A1 | 3/2005 | Pavani et al. |
| 2005/0250324 | A1 | 11/2005 | Saito et al. |
| 2011/0259751 | A1* | 10/2011 | Langereis ............... C25D 17/28 205/137 |
| 2012/0073974 | A1 | 3/2012 | Abas et al. |
| 2015/0042026 | A1 | 2/2015 | Uemura et al. |
| 2016/0305039 | A1 | 10/2016 | Kloosterboer et al. |

FOREIGN PATENT DOCUMENTS

| | | |
|---|---|---|
| CN | 103748694 | 4/2014 |
| DE | 102015105892 | 7/2016 |
| JP | H03138400 | 6/1991 |
| JP | 2015-101764 | 6/2015 |
| KR | 2007-0017718 | 2/2007 |
| KR | 2011-0028070 | 3/2011 |
| KR | 2012-0116044 | 10/2012 |
| KR | 2013-0022914 | 3/2013 |
| KR | 2016-0038553 | 4/2016 |
| KR | 2017-0010628 | 2/2017 |
| WO | WO 2010/011200 | 1/2010 |

OTHER PUBLICATIONS

English translation KR 20130022914 (Year: 2013).*
English translation DE102015105892 (Year: 2016).*
English translation JP 03138400, Okawa (Year: 1991).*
First Action Interview Pre-Interview Communication from U.S. Appl. No. 16/295,995 dated Feb. 22, 2021, 6 pgs.
First Action Interview Office Action from U.S. Appl. No. 16/295,995 dated Jun. 1, 2021, 5 pgs.
Final Office Action from U.S. Appl. No. 16/295,995 dated Dec. 3, 2021, 14 pgs.
Non-Final Office Action from U.S. Appl. No. 16/295,995 dated Jul. 5, 2022, 11 pgs.
First Office Action from Chinese Patent Application No. 201910258213.7 dated Oct. 12, 2023, 8 pgs.
Notification of Provisional Rejection from Korean Patent Application No. 10-2019-0037772 dated Jul. 19, 2023, 9 pgs.

* cited by examiner

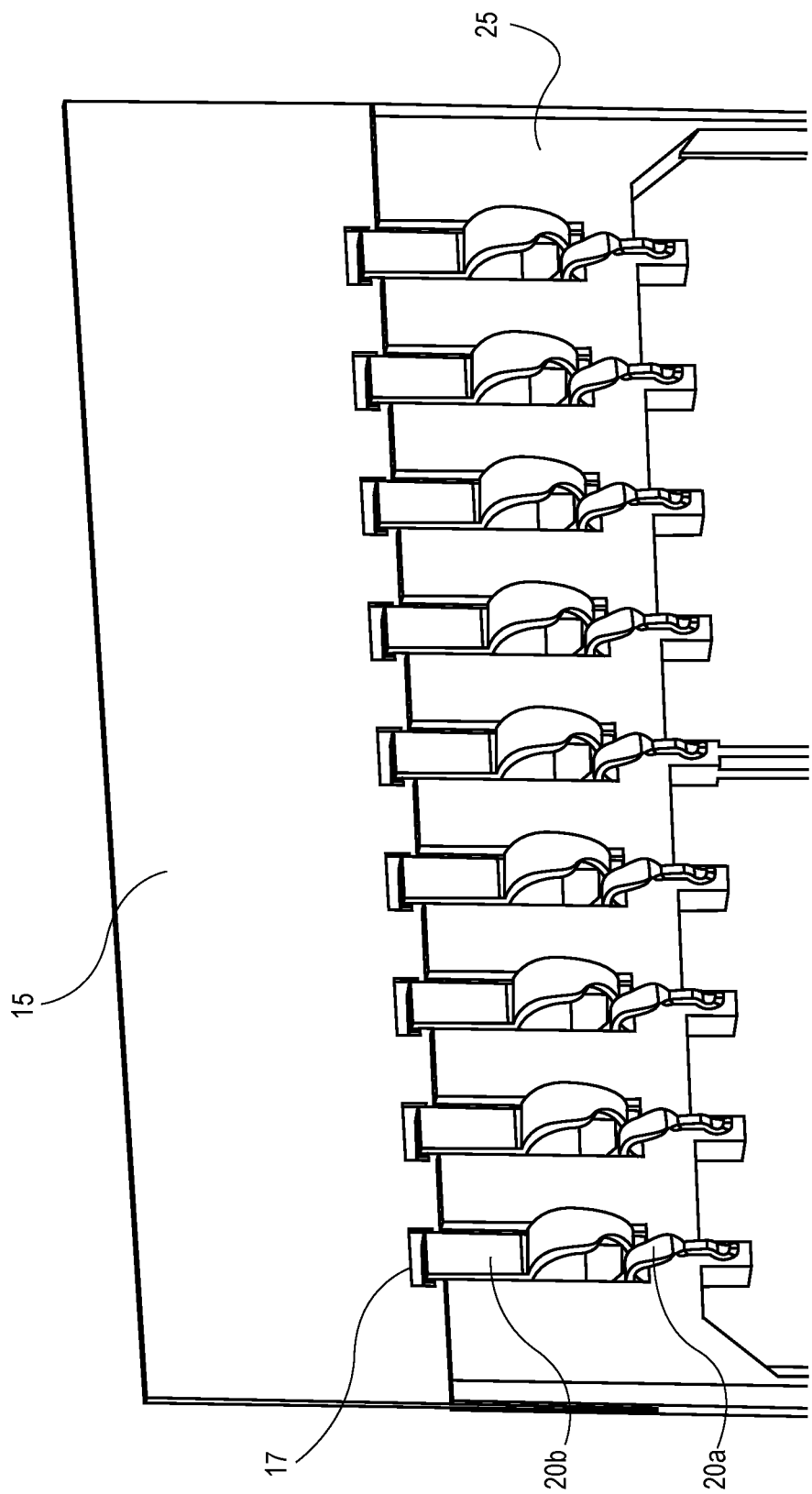

DUAL WAFER PLATING FIXTURE FOR A CONTINUOUS PLATING LINE

CROSS-REFERENCE TO RELATED APPLICATION

This application is a divisional of U.S. patent application Ser. No. 16/295,995 filed Mar. 7, 2019, which claims the priority benefit of the earlier filing date of U.S. Provisional Application No. 62/650,858, filed Mar. 30, 2018, which is hereby incorporated herein by reference in its entirety.

TECHNICAL FIELD

This disclosure relates generally to the field of electroplating. More particular, this disclosure relates to a plating fixture for use in electroplating substrates.

BACKGROUND

Photovoltaic (PV) cells, commonly known as solar cells, are devices for conversion of solar radiation into electrical energy. Generally, solar radiation impinging on the surface of, and entering into, the substrate of a solar cell creates electron and hole pairs in the bulk of the substrate. The electron and hole pairs migrate to p-doped and n-doped regions in the substrate, thereby creating a voltage differential between the doped regions. The doped regions are connected to the conductive regions on the solar cell to direct an electrical current from the cell to an external circuit. When PV cells are combined in an array such as a PV module, the electrical energy collected from all of the PV cells can be combined in series and parallel arrangements to provide power with a certain voltage and current.

BRIEF DESCRIPTION OF THE DRAWINGS

Embodiments will be readily understood by the following detailed description in conjunction with the accompanying drawings and the appended claims. Embodiments are illustrated by way of example and not by way of limitation in the figures of the accompanying drawings.

FIGS. 5A and 5B illustrate a perspective view and a side view, respectively, of a subassembly of contact clips, a carrier bus, a wafer backing, according to some embodiments.

DETAILED DESCRIPTION OF DISCLOSED EMBODIMENTS

Figure 1A:
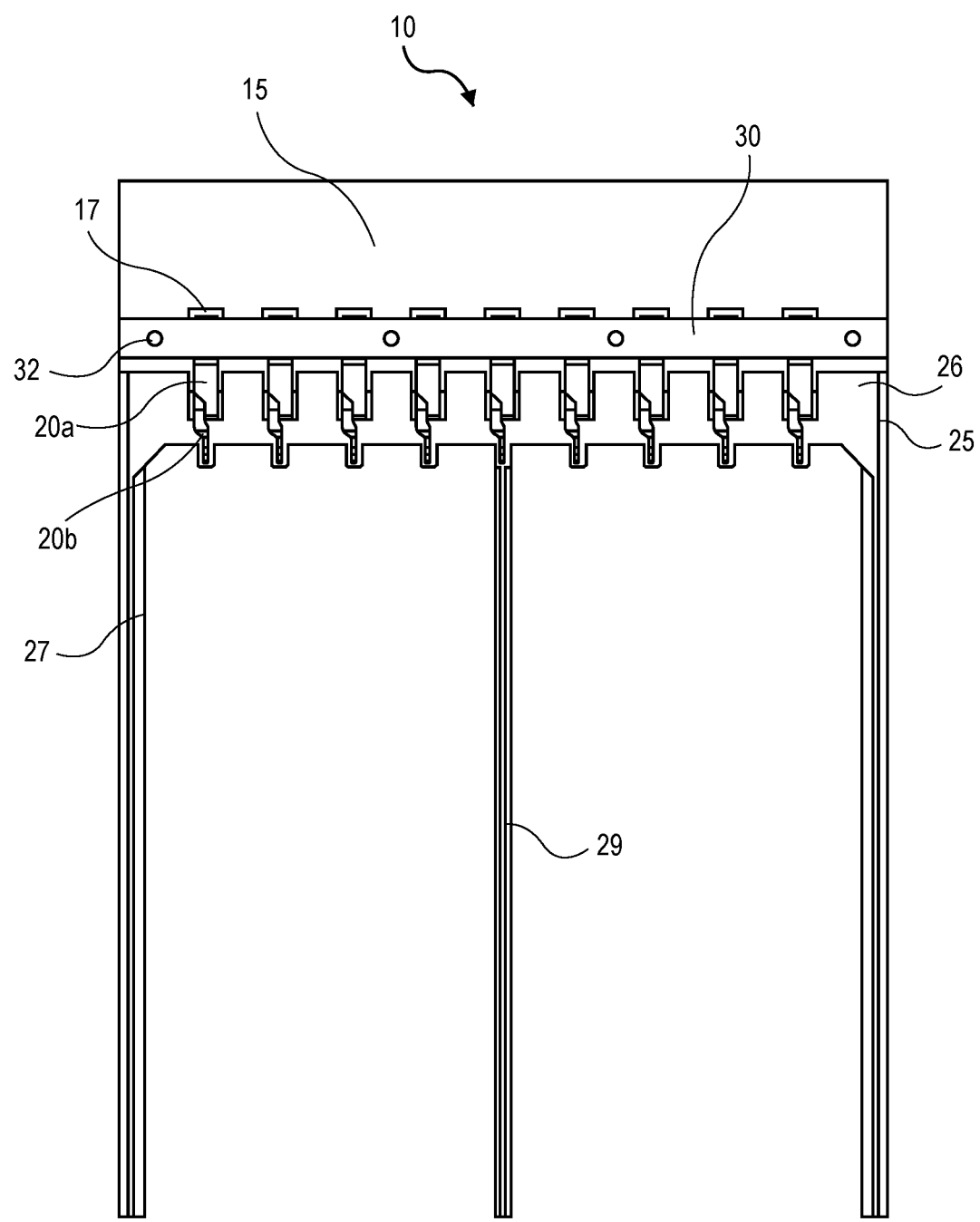
FIGS. 1A and 1B illustrate a front view and a perspective view, respectively, of an exemplary dual wafer plating fixture that can hold two wafers in a back to back configuration, according to some embodiments.
Figure 1B:
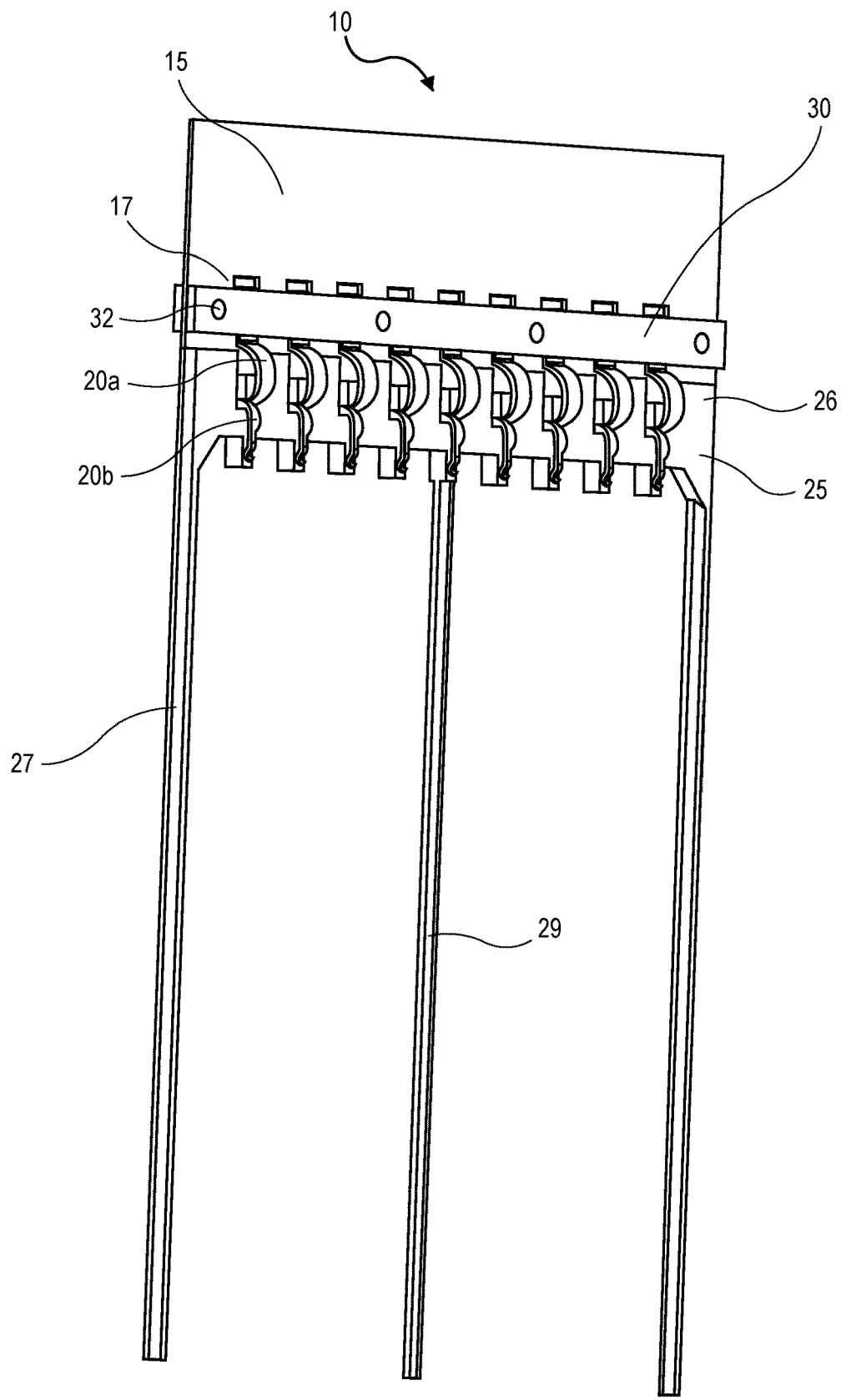

The following detailed description is merely illustrative in nature and is not intended to limit the embodiments of the subject matter of the application or uses of such embodiments. As used herein, the word "exemplary" means "serving as an example, instance, or illustration." Any implementation described herein as exemplary is not necessarily to be construed as preferred or advantageous over other implementations. Furthermore, there is no intention to be bound by any expressed or implied theory presented in the preceding technical field, background, or the following detailed description.

This specification includes references to "one embodiment" or "an embodiment." The appearances of the phrases "in one embodiment" or "in an embodiment" do not necessarily refer to the same embodiment. Particular features, structures, or characteristics may be combined in any suitable manner consistent with this disclosure.

Terminology. The following paragraphs provide definitions and/or context for terms found in this disclosure (including the appended claims):

As used herein, "regions" or "portions" can be used to describe discrete areas, volumes, divisions or locations of an object or material having definable characteristics but not always fixed boundaries.

"Comprising." This term is open-ended. As used in the appended claims, this term does not foreclose additional structure or steps.

"Configured To." Various units or components may be described or claimed as "configured to" perform a task or tasks. In such contexts, "configured to" is used to connote structure by indicating that the units/components include structure that performs those task or tasks during operation. As such, the unit/component can be said to be configured to perform the task even when the specified unit/component is not currently operational (e.g., is not on/active). Reciting that a unit/circuit/component is "configured to" perform one or more tasks is expressly intended not to invoke 35 U.S.C. § 112, sixth paragraph, for that unit/component.

"First," "Second," etc. As used herein, these terms are used as labels for nouns that they precede, and do not imply any type of ordering (e.g., spatial, temporal, logical, etc.).

"Based On." As used herein, this term is used to describe one or more factors that affect a determination. This term does not foreclose additional factors that may affect a determination. That is, a determination may be solely based on those factors or based, at least in part, on those factors. Consider the phrase "determine A based on B." While B may be a factor that affects the determination of A, such a phrase does not foreclose the determination of A from also being based on C. In other instances, A may be determined based solely on B.

"Coupled"—The following description refers to elements or nodes or features being "coupled" together. As used herein, unless expressly stated otherwise, "coupled" means that one element/node/feature is directly or indirectly joined to (or directly or indirectly communicates with) another element/node/feature, and not necessarily mechanically.

"Inhibit"—As used herein, inhibit is used to describe a reducing or minimizing effect. When a component or feature is described as inhibiting an action, motion, or condition it may completely prevent the result or outcome or future state completely. Additionally, "inhibit" can also refer to a reduction or lessening of the outcome, performance, and/or effect which might otherwise occur. Accordingly, when a component, element, or feature is referred to as inhibiting a result or state, it need not completely prevent or eliminate the result or state.

In addition, certain terminology may also be used in the following description for the purpose of reference only, and thus are not intended to be limiting. For example, terms such as "upper", "lower", "above", and "below" refer to directions in the drawings to which reference is made. Terms such as "front", "back", "rear", "side", "outboard", and "inboard" describe the orientation and/or location of portions of the component within a consistent but arbitrary frame of reference which is made clear by reference to the text and the associated drawings describing the component under discussion. Such terminology may include the words specifically mentioned above, derivatives thereof, and words of similar import.

In the following description, numerous specific details are set forth, such as specific operations, in order to provide a thorough understanding of embodiments of the present disclosure. It will be apparent to one skilled in the art that embodiments of the present disclosure may be practiced without these specific details. In other instances, well-known techniques are not described in detail in order to not unnecessarily obscure embodiments of the present disclosure.

Electroplating is a deposition technique that may be used to form a metal layer on a substrate. In some electroplating processes, the anode may be made out of the metal to be deposited, and the cathode may be the substrate to be plated. Both the anode and the cathode are immersed in an electrolyte solution, and a voltage is applied across the anode and cathode so that an electrical current flows between them. This causes oxidation of the metal at the anode so that ions of the metal are dissolved in the solution. This also causes reduction of the metal ions at the cathode so that a layer of the metal is deposited onto the substrate. In other electroplating processes, the solution may have ions of the metal to be plated, and the anode may be a non-consumable anode. In this case, the metal ions may be periodically replenished in the bath.

For continuous plating systems current tool designs load a single wafer or other substrate at each position of the belt/clip. Each wafer is transported through the plating channels and processed in the same manner. This design provides wafer to wafer plating uniformity. However, it limits the tool throughput because only one wafer is processed at a time. Efforts to process multiple wafers to improved throughput have been closely examined. Among them are, Back to Back wafer plating: contact clips two wafers back to back on the belt, Belt-in-Belt (nest belts): two drivers and two belts in one process chamber, and U Shape Tool: the wafer goes through a U turning wheel. Unfortunately, all these approaches require significant tool design change and development time.

Many continuous plating systems have been designed to electroplate metals, such as Cu and Sn, onto a substrate with good plating uniformity, reliability and safety, low chemical drag-out, and low water usage. In certain examples, these systems utilize a contact belt and contact clips to hold wafers picked up from a cassette. The wafers are transported continuously through the machine where, during the plating process, current is supplied to the wafers for electroplating. The plating systems typically consist of channels and rectifiers to effectively deposit the metal to the required thickness. After the process is completed, the wafers are automatically unloaded from the contact belt and placed in a cassette. One of the drawbacks of these systems is that only a single wafer can be loaded onto each position on the contract belt. Thus, it would be extremely advantageous if two wafers could be loaded at each position on the contact belt. This would double the throughput through a continuous belt plating line.

Recognizing the benefits of a higher throughput system the inventors designed a fixture that enables both the loading and processing two wafers per position on the contact belt of a continuous plating line. However, to design such a fixture several design elements needed to be considered. The considerations that were taken into account during the design process included: providing a fixture where two wafers could be loaded back to back without touching each other; low drag out when two wafers are loaded; allowing for rinsing on the back side of wafers (the sides closest to each other and facing the fixture); that the fixture is substantially nonconductive, such that only the contact clips are being plated, resulting in minimum stripping; low cost of manufacture; and easy maintenance.

Figure 1C:
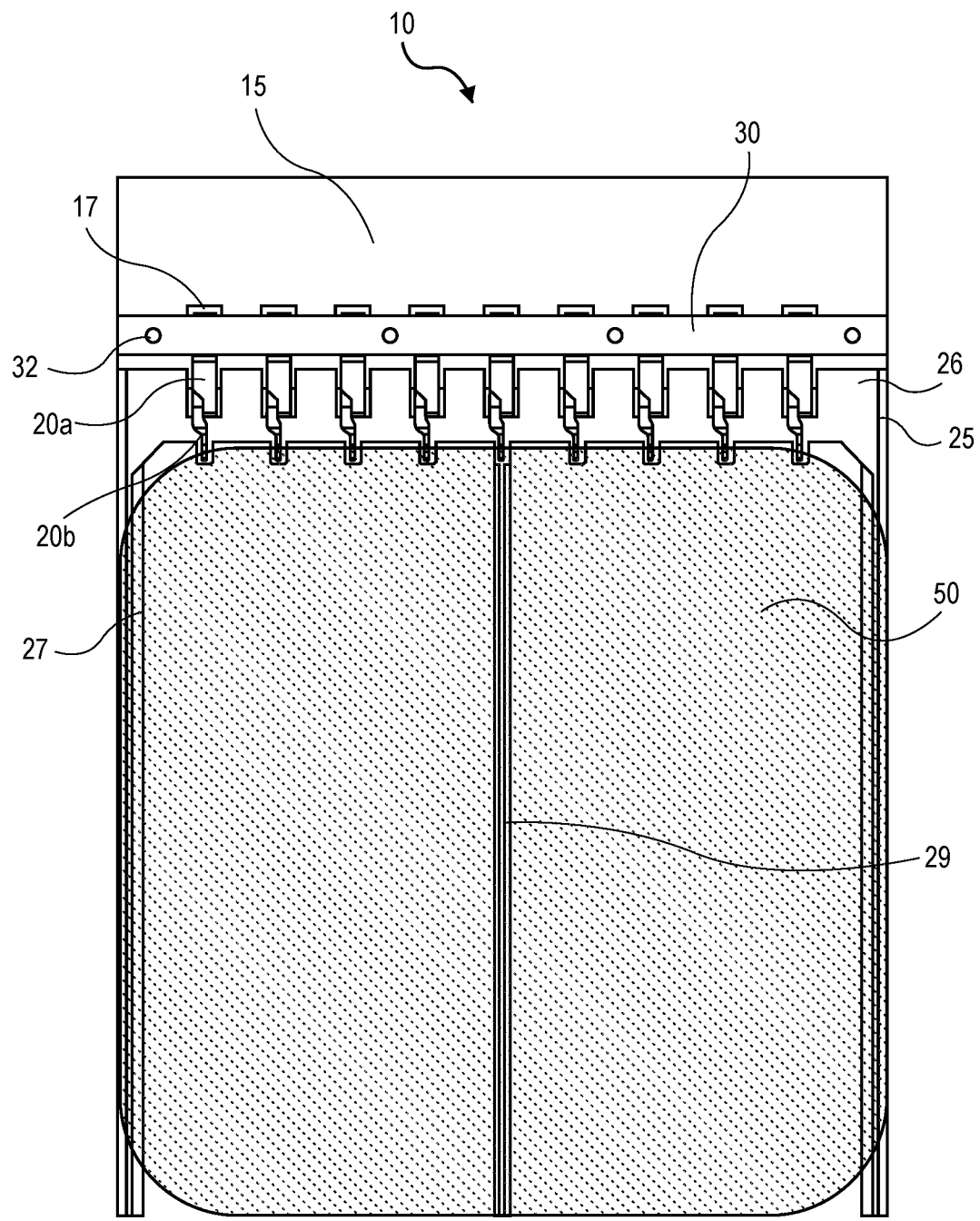
FIG. 1C illustrates a front view of the dual wafer plating fixture shown in FIG. 1A showing the position of a wafer on the front side of the fixture, according to some embodiments.
Figure 2A:
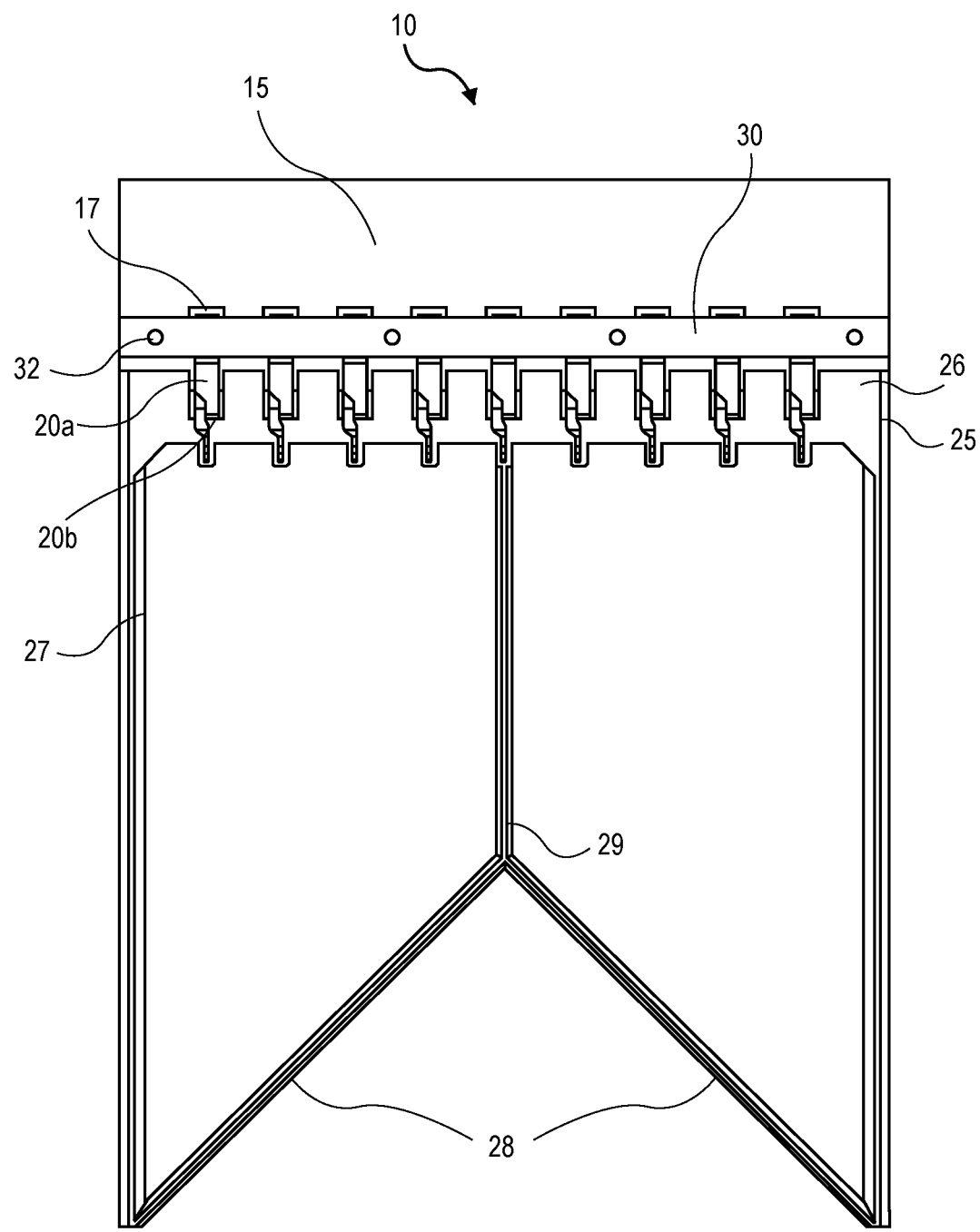
FIGS. 2A and 2B illustrate a front view and a perspective view, respectively, of an exemplary dual wafer plating fixture having a variation of a substrate backer design that includes two vertical bars with a "Y" support in the middle to improve rigidity, according to some embodiments.
Figure 2B:
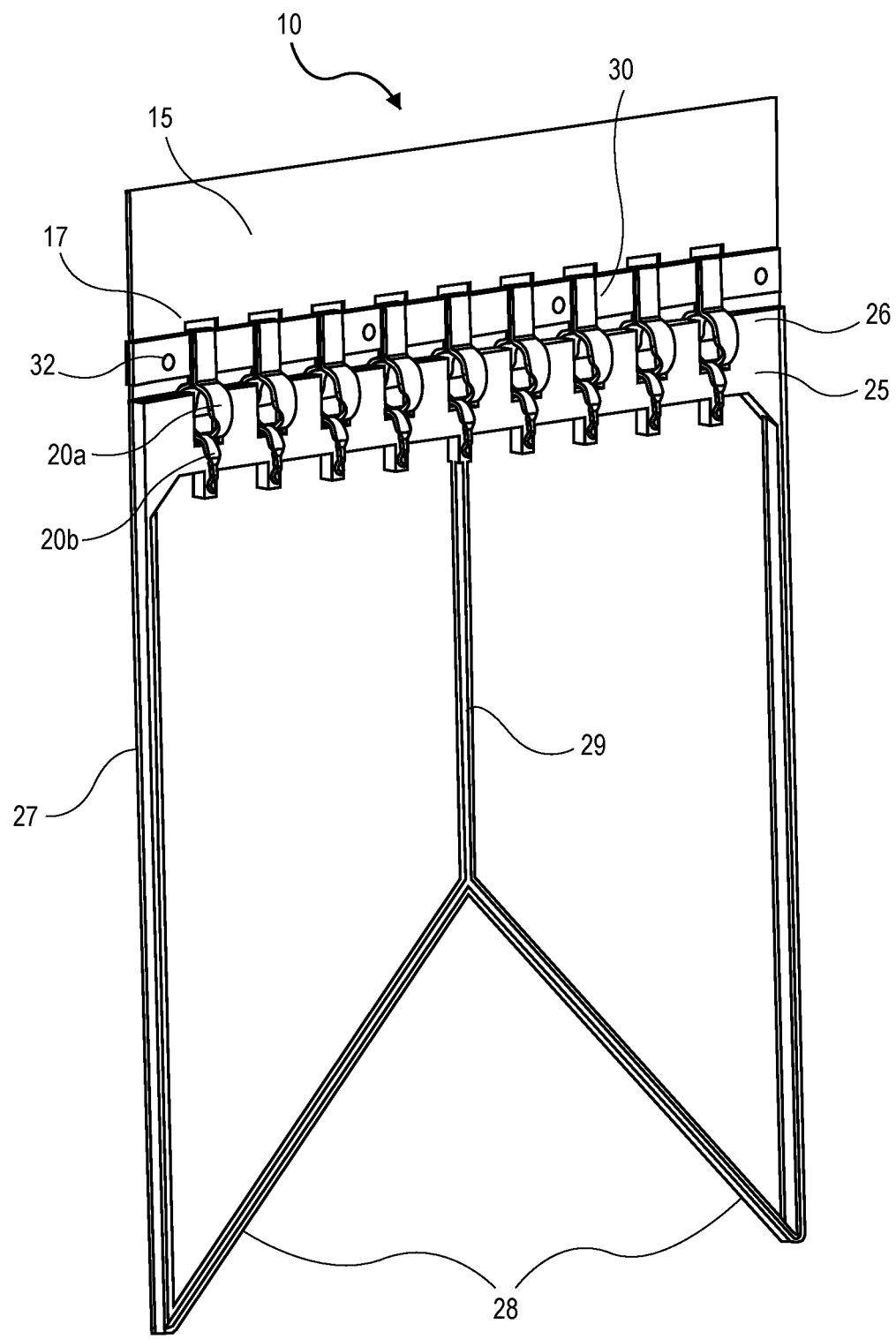

To provide a solution that doubles the throughput of a continuous belt plating system the inventors have designed a dual wafer plating fixture that can hold two wafers in a back-to-back configuration. For example, a first wafer can be located on a front side of the fixture (see FIG. 1C) and a second wafer can be located on a back side, opposite the front side of the fixture (this would be behind the wafer shown in FIG. 1C, substantially overlapping).

Disclosed herein is a wafer plating fixture for use in simultaneously electroplating two substrates. In embodiments, the wafer plating fixture includes: an electrically conductive carrier bus; a plurality of contact clips electrically coupled to the carrier bus; and a non-conductive substrate backer to separate the two substrates coupled to the carrier bus. In certain embodiments, the dual wafer plating fixture includes a carrier bus, three or more contact clips, such as between about 3 and about 12 contact clips, on each side (opposite sides of the carrier bus) for clipping a wafer or substrate to each side of the dual wafer plating fixture, and a substrate backer to separate the wafers and keep them from touching during the plating process. In embodiments, the plurality of contact clips are distributed on either side of the carrier bus and are configured to hold the two substrates in place and electrically couple the two substrates to the carrier bus, thus providing an electrical pathway between the carrier bus and the two substrates. In embodiments the electrically conductive carrier bus is configured to reversibly attach to an electrically conductive continuous plating belt, for example via clips, clamps, hooks or any other method of reversible attachment.

In embodiments, the substrate backer includes a top portion that extends along a bottom edge portion of the carrier bus and at least one, such as two or more distal extensions, for example one, two, three, or even four or more, that extend from the bottom edge of the top portion of the substrate backer. When the substrates are clipped to the wafer plating fixture the distal extensions provide a means to prevent the two substrates from contacting, for example from being squeezed together from the pressure of the clips on the two wafers. This also allows for minimal contact with the back side of the wafer and the substrate backer. In certain embodiments, the substrate backer partially overlaps the bottom edge portion of the carrier bus, e.g. the carrier bus slides into a slot in the top edge of the substrate backer, and they may be coupled together, for example with an adhesive.

Alternatively, or in addition to, the substrate backer may be formed as an overmold with the substrate backer around the lower edge of the carrier bus. The carrier bus may include perforations that allow the overmold material to pass through, adding to the structural coupling of the carrier bus and the substrate backer. In certain examples, two or more of the distal extensions are connected by cross bracing, for example to provide rigidity and/or durability. In embodiments, the distal extensions are configured to minimize contact with the two substrates. For example, rather than being flat, the distal extensions may be ovoid, round, diamond, or other shape in cross section for at least a portion of their length to minimize contact with the two substrates. Alternatively, or in addition to, the distal extensions may include one or more protrusions along their length that are oriented to provide minimal contact with a tip of the protrusion and the substrates. In certain embodiments, the substrate backer includes lands, or landing sites, for the plurality of contact clips when there is no substrate present.

In embodiments, the plurality of contact clips are coupled to the carrier with clamp bars positioned on either side of the carrier bus. In embodiments, the plurality of contact clips comprise three or more contact clips distributed on each side of the carrier bus. In embodiments, each of the contact clips comprises a spring.

In specific embodiments, the carrier bus includes a plurality of horizontally distributed openings configured for passage of a contact clamp. In certain embodiments, a contact clamp is a single piece of metallic material that passes through one of the openings in the carrier bus. In certain embodiments, the plurality of contact clips comprise pairs of contact clips, wherein one member of the pair of contacts clips is disposed on one side of the carrier bus and the other member of the pair of contact clips is disposed on the opposite side of the carrier bus. In certain embodiments, each of the pairs of contact clips are two non-reversing mirrored pins.

Further disclosed herein a method of electroplating a plurality of substrates. In embodiments, the method includes: mounting two substrates to be plated onto a wafer plating fixture; mounting the wafer plating fixture on a continuous belt of a plating system; dipping the wafer plating fixture with the two substrates held thereon into an electroplating bath; and applying a voltage to the two substrates via the wafer plating fixture.

Turning now to the Figures. FIGS. 1A-2B show examples of a dual wafer plating fixture for a continuous plating line, in accordance with embodiments herein. With reference to FIGS. 1A-2B a dual wafer plating fixture 10 includes a carrier bus 15 and multiple sets of contact clips 20a and 20b coupled to the carrier bus 15. The dual wafer plating fixture 10 further includes a substrate backer 25 that is also coupled to the carrier bus 15. Each dual wafer plating fixture is capable of holding two substrates back to back and can be loaded to the continuous plating tool for the plating process. Thus, the carrier bus 15 can include additional features for loading onto a continuous plating tool, for example additional cut outs, nubs or other protrusions which may aid in loading and/or placement of the carrier bus onto the belt of a continuous plating tool. In the embodiments shown in FIGS. 1A-2B the sets of contact clips 20a and 20b are coupled to the carrier bus 15 with opposing clamp bars 30 that are connected to each other by fasteners 32. The fasteners 32 can be any conventional or non-conventional fastener, such as a screw, rivet, and the like. Other means of coupling include welds, solder, braising, and adhesives. However, in all cases the contact clips 20a and 20b should be electrically coupled (for example, capable of transmission of a current) to the carrier bus 15. In the embodiments shown, the carrier bus 15 includes cutouts 17. The cutouts 17 are position so that each set of contact clips 20a and 20b can be threaded through to the opposite side. The opposing clamps 30 secure the contact clips 20a and 20b to the carrier bus 15 and hold them in place when pressed open to load/unload a substrate. The dual wafer plating fixture 10 further includes a substrate backer 25 to separate the substrates. The substrate backer 25 can take many forms as long as the substrates are kept apart during processing, which also will minimize chemical drag out during processing. For example, in the embodiment shown in FIGS. 1A-1C the substrate backer 25 is composed of a top edge portion 26, two laterally spaced vertically extending backer bars 27 that extends distally from the bottom of the top edge portion 26, and a single central backer bar 29 that extends distally from the bottom of the top edge portion 26. In the alternative embodiment shown in FIGS. 2A and 2B the central backer bar 29 only extends partially the length of the two laterally spaced vertically extending backer bars 27 which connect to each other at the distal end by cross members 28 forming a "Y" support in the middle to improve rigidity and durability. Two substrates 50 can be loaded on each side of the substrate backer 25 and held in position by the set of contact clips 20a and 20b. In either of these embodiments, the vertically extending bars are configured to minimize contact area with the substrate, for example in cross section they may take a round, oval or diamond shape in at least a portion of their length. Other geometric shapes that minimize contact between the substrate backer and the substrate are also contemplated. In alternate embodiments, the vertically extending backer bars 27 and 29 include nubs or protrusions that extend outward from the bar and contact the substrate, thus minimizing the contact area between the substrate and the substrate backer 25. In another example the cross sectional profile of ovoid, round, diamond and the like, only extends within certain regions of the backer bars 27 and 29, for example at the distal and proximal ends and in one or more locations in between, which can be regular spacing or irregular spacing. In certain embodiments, the distal end of one or more of the backer bars 27 and/or 29 may include a lip or other feature to hold the bottom edge of the wafers in place and add mechanical support to the wafer. Other designs can also be considered, for example, a two-bar design with the two bars located away from the edge of the substrate but closer to the middle of the substrate, which can still keep the two substrates from touching each other while loaded on the fixture, or even a single central bar. Regardless of the configuration, the substrate backer advantageously creates a rinsing space between the two opposing surfaces of the substrates to be plated. In embodiments, the substrate backer further includes a number of small vertical extension at the lower edge that serve as lands or landing pads for the clips when there is no substrate present. For example the tip of a clip that would normally contact the substrate when inserted now contacts the small extensions of the substrate backer. In embodiments, the substrate backer is constructed of a non-conductive material, for example a plastic that may be injected molded or 3D printed, or any other conventional manufacturing technique. The material should further be selected to be reasonably chemically inert and dimensional stable through process cycles (e.g. chemical and thermal) and minimize chemical drag out. In embodiments, the substrate backer is composed of a non-conductive material, such as polypropylene (PP), polyvinyl chloride (PVC), polyvinylidene difluoride (PVDF), or other chemical resistant materials. The thickness of the substrate backer is selected such that plating bath liquid is free to move between the two substrates. In certain examples the substrate backer thickness, for example the thickest portion between two substrates is between about 1.0 mm and about 5.0 mm, such as about 1.5 mm to about 3.0 mm. In certain embodiments, the carrier bus and the substrate backer are substantially rigid. In other embodiments, the carrier bus and/or the substrate backer are flexible, for example so that the dual wafer plating fixture can be bent about or around wheels inside a plating line. In certain embodiments, the carrier bus and/or the substrate backer are sectioned so the dual wafer plating fixture can be bent about or around wheels inside the plating line. In certain embodiments, one or both of the carrier bus and the substrate backer include an articulation feature, such as a hinge, to provide flexibility. Alternatively, the carrier bus can be formed from a solid piece of metal (e.g. SS) that is ductile or supple enough that it can conform to the wheels and not suffer metal fatigue. In certain embodiments, the top edge of the substrate backer is ductile or supple enough that it can conform to the wheels and not suffer fatigue. In certain embodiments, the top edge of the substrate backer is made from several pieces that may or may not be connected.

Figure 3:
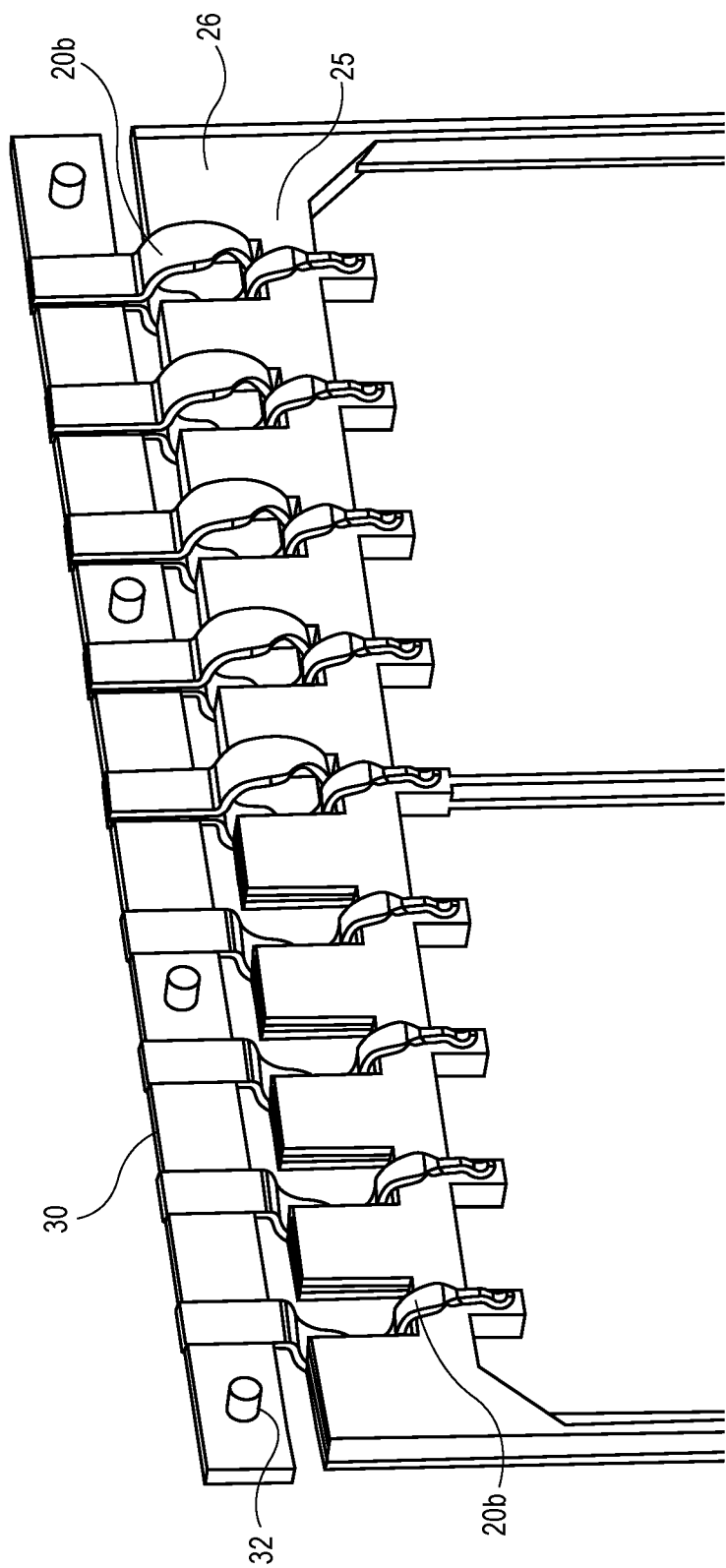
FIG. 3 illustrates a perspective view of the assembly of contact clips, a clamp and a wafer backing, according to some embodiments.

FIG. 3 shows a partial assembly of contact clips 20a, 20b, clamp bar 30 (with fasteners 32) and the substrate backer 25. As can be seen in FIG. 3, the clamp bar 30 clamps down the contact clips 20a and 20b and holds them in place against the carrier bus (not shown in this view). In the embodiment shown, the contact clips 20a and 20b are two non-reversing mirrored pins (see FIG. 7 for greater detail). The contact clips 20a and 20b hold the substrate during processing and also transfer electric current to substrate for plating. The contact clips 20a and 20b can be opened manually or by automation tool when loading/unloading substrate to/from the fixture. In the embodiment shown, the contact clips 20a and 20b are locked by the clamp bar 30 from both sides of the dual substrate plating fixture 10. As discussed earlier, the clamps can be coupled to the carrier bus with one or more fasteners, such as one or more screws and/or rivets. Non-fastener coupling is also contemplated. While non-reversing mirrored pins are depicted in the embodiments shown in FIGS. 1A-7 it is envisioned that other types of clips could be used, for example wire clips, spring actuated clips and the like. Several examples of clips that could be used in the disclosed dual wafer plating fixture can be found in U.S. Pat. No. 8,317,987, which is specifically incorporated herein by reference.

Figure 4:
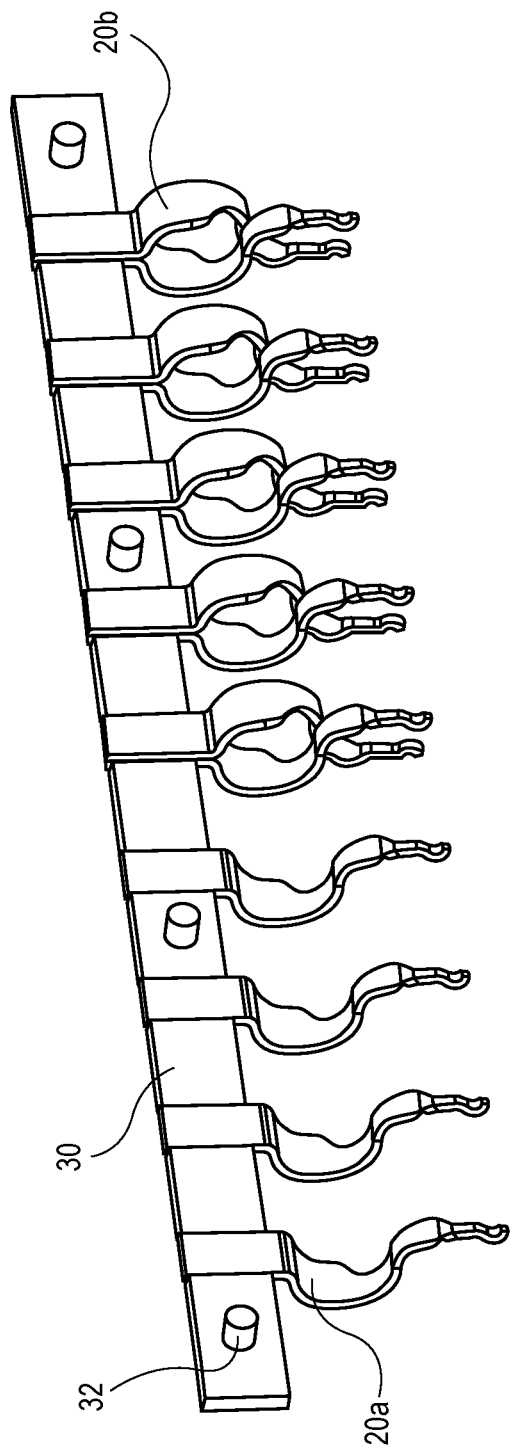
FIG. 4 illustrates a perspective view of a subassembly of contact clips and a clamp, according to some embodiments.
Figure 5B:
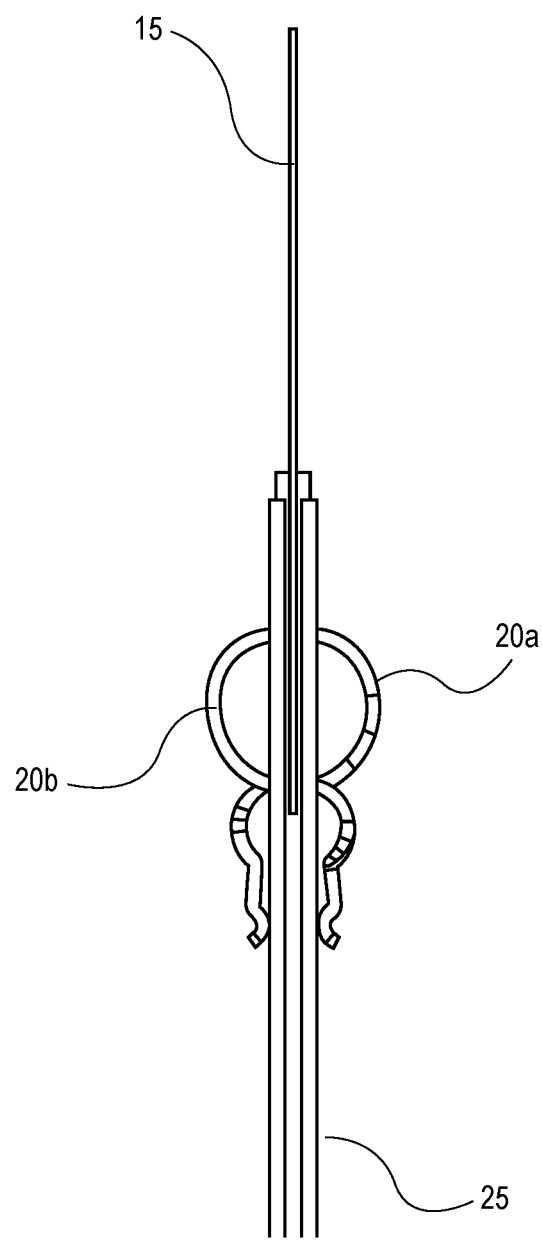

FIGS. 4, 5A and 5B illustrate the carrier bus 15 with cutouts 17, contact clips and substrate backer sub-assemblies. As shown in FIG. 5A the contact clips 20a and 20b landed on extensions of the substrate backer when no substrate is present. To load the substrates on the fixture, one can open the contact clips 20a and 20b by pressing on the upper curve section, put the substrates in place, then release the pressure and close the contact clips 20a and 20b. When the contact clips close on the substrate they land on contact pads of the substrate which allow the transmission of electricity from the contact clips (and hence the carrier bus can continuous belt) to transfer electrical current to the substrate during the plating process. The clamps 30 provide the mechanical strength to secure the contact clips 20a and 20b and maintain clip position. The clamps 20a and 20b are also constructed of an electrically conductive material such as stainless steel and the like.

Figure 6:
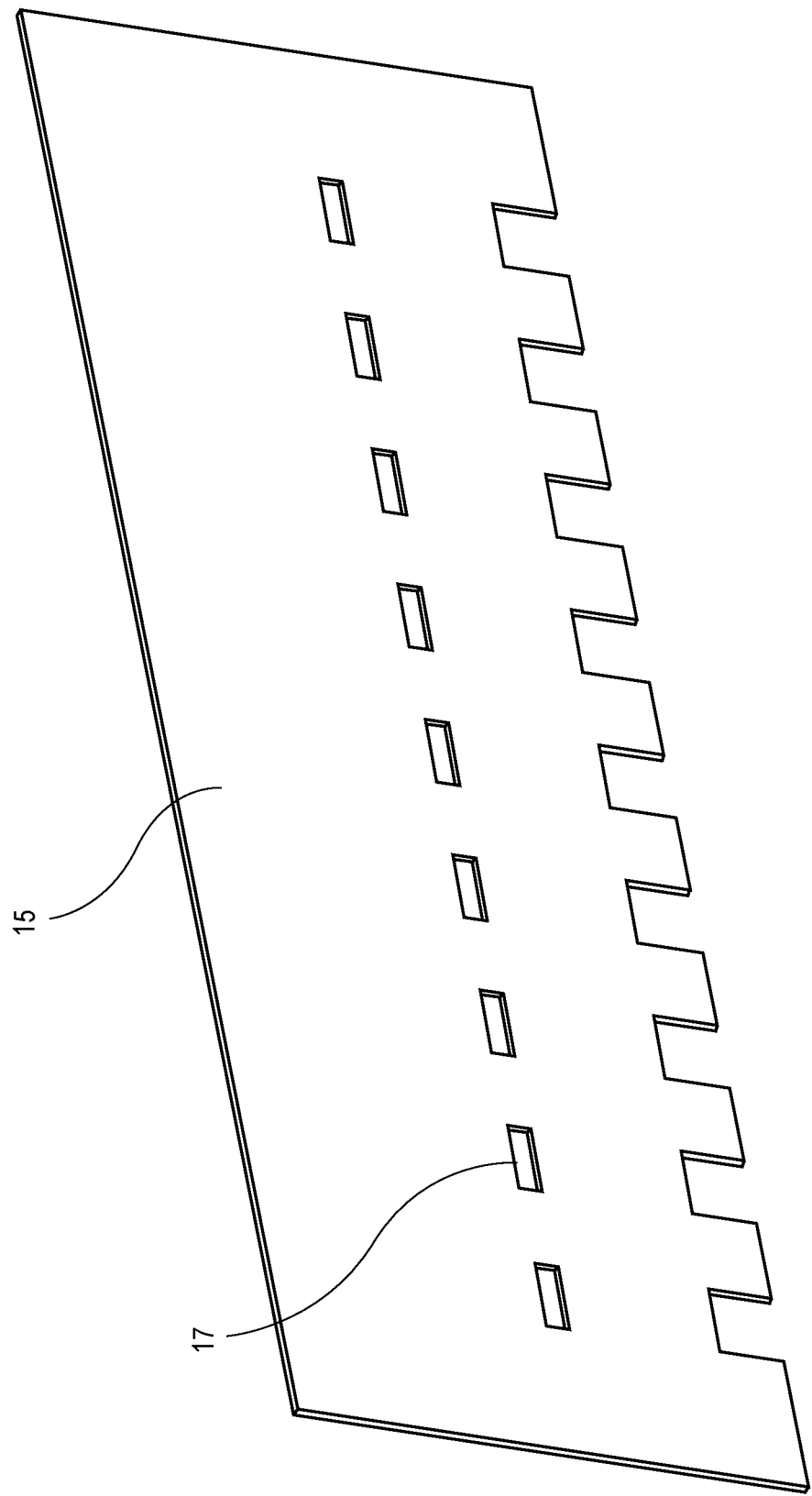
FIG. 6 illustrates a perspective view of an exemplary carrier bus, according to some embodiments.

FIG. 6 illustrates a carrier bus. As discussed previously, the openings on the carrier bus 15 are for mounting the clips. The carrier bus 15 is the part that will be loading directly on the belt/contact clips of the continuous plating line. The carrier bus 15 is made of metal with good electrical conductivity and corrosion resistance to plating chemistry, for example stainless steel, titanium, or copper alloys. This is the part that is in direct contact with the contact belt of the plating line. Plating current is transferred from contact belt in the plating tool to the carrier bus, then to the contact clips on the fixture, and then to the substrates.

Figure 7:
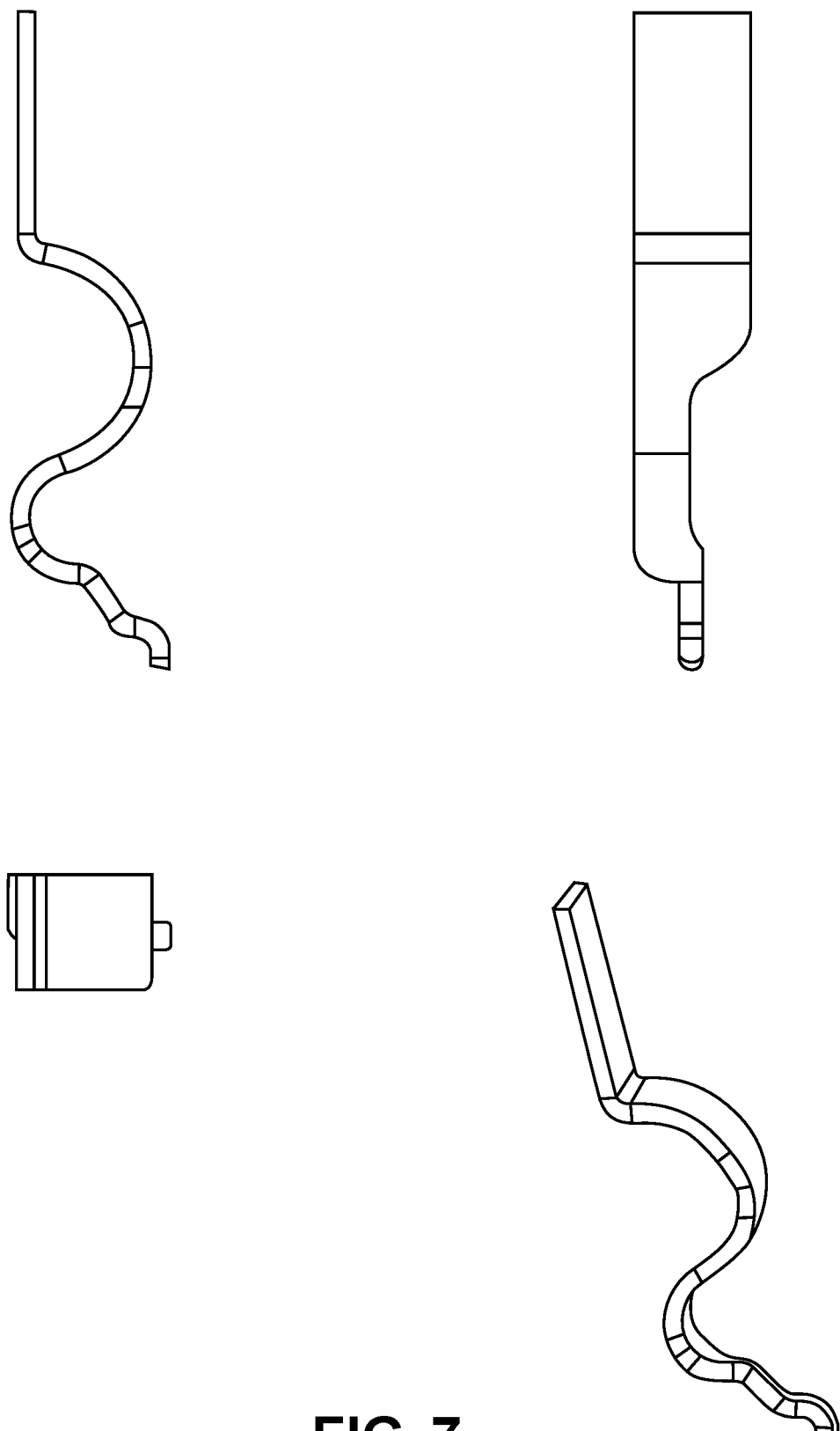
FIG. 7 illustrates a set of views of an exemplary contact clip, according to some embodiments.

FIG. 7 shows several views of an exemplary contact clip. The material of the clip is conductive to transfer current to the substrate, has good mechanical strength and toughness to hold the substrate, and good corrosion resistance to plating chemistry. The spring force of the contact clips can be tailored by design such as the radius of the curve, and angle of the tip being bent. In embodiments, the spring force of a contact clip is between about 50 grams and about 200 grams. The contact clips: provide mechanical strength to hold substrates; are conductive to transfer current to substrates; and are corrosion resistant to plating chemistries. Contact clips can be pressed open when loading substrates. Once the substrates are in place, pressure is released and the contact clips close to hold the substrates. Two substrates can be loaded, one on each side of the fixture. The clips may individually be formed from a single piece of stainless steel, such as SS 316 or SS 301. A contact feature may be formed at the tip portion of the clip. The contact feature is the part of the clip which makes physical contact with the substrate to be plated (for example, at the contact pads on a surface of a semiconductor wafer). In other embodiments, a contact clip may include both metal and plastic parts. For example a contact clip may include a plastic base portion and, a metal spring-attachment plate, a metal screw, a metal double-torsion spring-loaded clip, a plastic lever, and a rubber O-ring (see for example U.S. Pat. No. 8,317,987). In certain embodiments, the contact clip may include a non-conductive coating to minimize plating on the clip, for example leaving metal exposed only at the tip of the clip where it contacts the substrate and exposed at the area between the contact clip and carrier bus.

In certain embodiments, a robotic machine may be configured to open all the contact clips and a wafer (or other substrate to be processed) may be placed therein. The opening of the contact clips may be accomplished by simultaneously pressing down on the loops or handles of the clips to release the pressure of the contact clips. The contact clips may then be closed by the robotic machine releasing the spring-loaded contact clips such that the contact features press against the metallic contact pads on the wafer to hold the wafer (or other substrate or other substrate to be plated) firmly in place. Once the wafers (or other substrate) to be processed have been loaded onto the carrier plating and other processing may be performed. After the processing, a robotic machine may be configured to re-open all the contact clips so that the processed wafers (or other substrates) may be removed and replaced with wafers to be processed. Alternatively the clips may be manually actuated.

Figure 8:
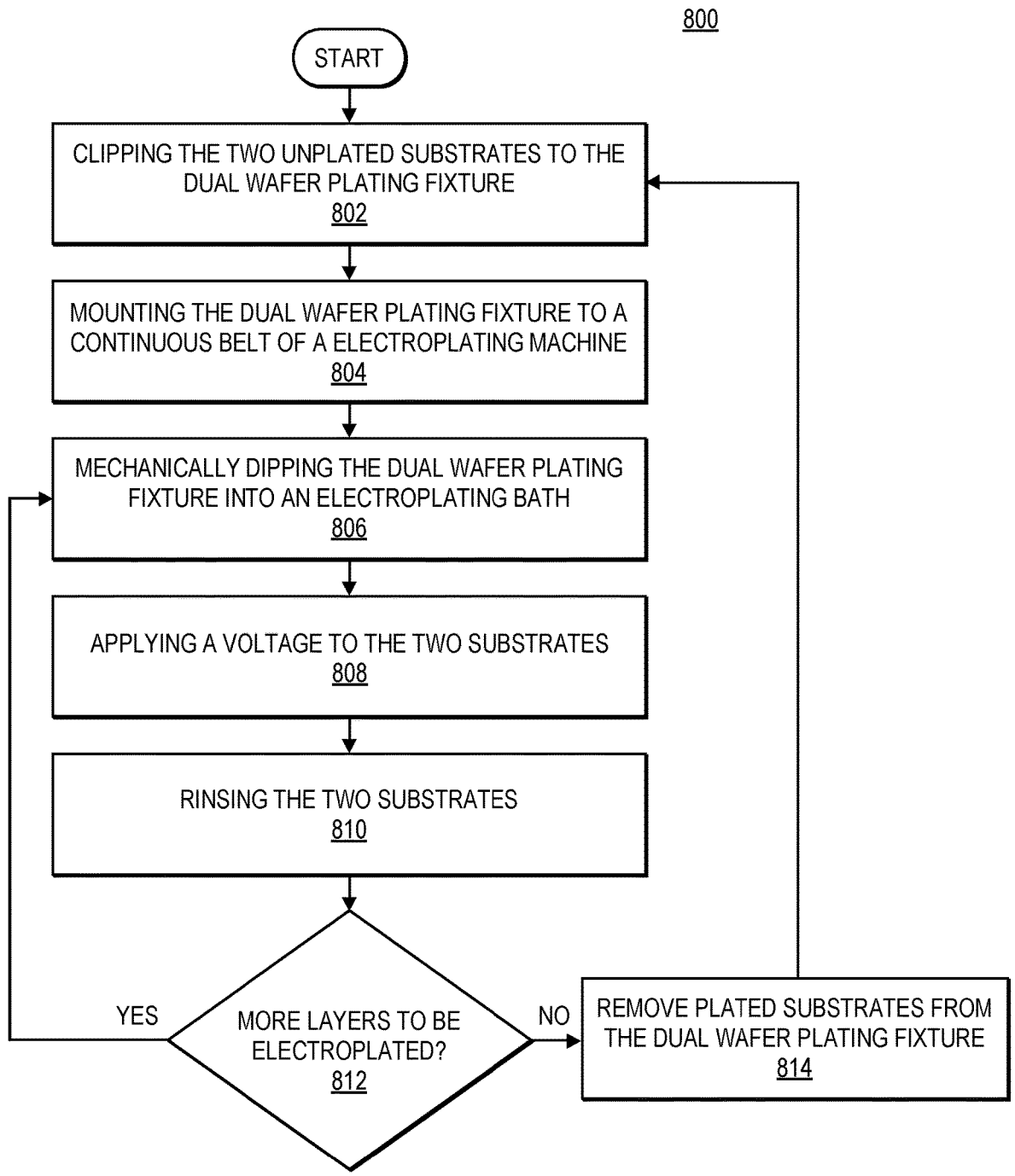
FIG. 8 illustrates is a flow chart of a method of using a dual wafer plating fixture to electroplate a plurality of substrates, according to some embodiments.

FIG. 8 is a flow chart of a method 800 of using a dual wafer plating fixture to electroplate a plurality of substrates in accordance with an embodiment of the invention. In block 802, a robotic loader may be used to clip a two substrates to the dual wafer plating fixture. Alternatively they may be manually loaded. In block 804, the dual wafer plating fixture may be mounted a continuous belt of an electroplating machine.

In block 806, the electroplating machine may mechanically dip the dual wafer plating fixture into an electroplating bath.

In block 808, a voltage may be applied to the two substrates by way of the electrically-conductive path traveling through the carrier bus, and the contact clips to contact pads on the substrate. In one example, the substrates may comprise silicon wafers. The contact clips may make contact, for example, with a base (seed) layer of copper (or other metal) on the surface of the substrates. A metal layer may then be deposited from the electroplating bath on top of the base layer.

In block 810, the dual wafer plating fixture and the two substrates or rinsed, for example to remove any residual material from the electroplating bath.

In block 812, if more metal layers are to be electroplated onto the substrates, then the method 800 may loop back to block 806 and the may be mechanically dipped into a different electroplating bath to deposit a different metal layer so as to form a multi-layer stack for a metal contact, for example. When no more metal layers are to be electroplated onto the substrates, then per block 814 the substrates may be removed from the carrier, by a robotic machine, for example. Thereafter, the method 800 may loop back to block 802 and other (unplated) substrates to be processed may be clipped onto the dual wafer plating fixture.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A method of electroplating a plurality of substrates, the method comprising:
    mounting two substrates to be plated onto a wafer plating fixture, the wafer plating fixture comprising:
        an electrically conductive carrier bus;
        a plurality of contact clips electrically coupled to the electrically conductive carrier bus, wherein the plurality of contact clips are distributed on opposite sides of the carrier bus and configured to electrically couple the two substrates to the carrier bus, wherein each one of the plurality of contact clips is symmetric about the opposite sides of the electrically conductive carrier bus, and wherein each one of the plurality of contact clips comprises a conductive material having a non-conductive coating thereon; and
        a non-conductive substrate backer coupled to the electrically conductive carrier bus and configured to separate the two substrates, wherein the non-conductive substrate backer comprises a top portion that extends along a bottom edge portion of the electrically conductive carrier bus and two or more distal extensions that extend from the top portion of the non-conductive substrate backer, wherein the distal extensions are configured to keep the two substrates from contacting;
    mounting the wafer plating fixture on a continuous belt of a plating system;
    dipping the wafer plating fixture with the two substrates held thereon into an electroplating bath; and
    applying a voltage to the two substrates via the wafer plating fixture to simultaneously electroplate the two substrates.

2. The method of claim 1, wherein the non-conductive substrate backer comprises two distal extensions.

3. The method of claim 1, wherein the non-conductive substrate backer comprises three distal extensions.

4. The method of claim 1, wherein the two or more distal extensions are connected by cross bracing to provide rigidity.

5. The method of claim 1, wherein the distal extensions are ovoid, round or diamond in cross section for at least a portion of their length to minimize contact with the two substrates.

6. The method of claim 1, wherein the distal extensions comprise one or more protrusions along their length that are oriented to provide minimal contact with a tip of the protrusion and the two substrates.

7. The method of claim 1, wherein the non-conductive substrate backer comprises landing sites for the plurality of contact clips when there is no substrate.

8. The method of claim 1, wherein the plurality of contact clips are coupled to the electrically conductive carrier bus with a clamp bar on opposite sides of the electrically conductive carrier bus.

9. The method of claim 1, wherein the plurality of contact clips comprise three or more contact clips distributed on each side of the electrically conductive carrier bus.

10. The method of claim 1, wherein each of the contact clips comprises a spring.

11. The method of claim 1, wherein the electrically conductive carrier bus comprises a plurality of horizontally distributed openings configured for passage of a contact clamp.

12. The method of claim 11, wherein the contact clamp comprises a single piece of metallic material that passes through one of the openings in the electrically conductive carrier bus.

13. The method of claim 1, wherein the plurality of contact clips comprise pairs of contact clips, wherein one member of the pair of contacts clips is disposed on one side of the electrically conductive carrier bus and the other member of the pair of contact clips is disposed on an opposite side of the electrically conductive carrier bus.

14. The method of claim 1, wherein a pair of the plurality of contact clips comprises two non-reversing mirrored pins.

* * * * *